(12) United States Patent
Bandic et al.

(10) Patent No.: US 6,229,193 B1
(45) Date of Patent: May 8, 2001

(54) MULTIPLE STAGE HIGH POWER DIODE

(75) Inventors: Zvonimir Z. Bandic; Eric C. Piquette; Thomas C. McGill, all of Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 09/283,653

(22) Filed: Apr. 1, 1999

Related U.S. Application Data

(60) Provisional application No. 60/080,875, filed on Apr. 6, 1998.

(51) Int. Cl.[7] .................................................. H01L 27/095
(52) U.S. Cl. ......................... 257/486; 438/571; 438/572; 438/573; 438/575; 438/580; 438/582; 257/473
(58) Field of Search .............................. 438/92, 534, 570, 438/575, 580, 582, 622, 660, 661, 648, 680, FOR 173, FOR 335, 572, 573; 257/473

(56) References Cited

U.S. PATENT DOCUMENTS

| | | | |
|---|---|---|---|
| 3,652,905 | * | 3/1972 | Page ...................................... 257/483 |
| 4,374,012 | * | 2/1983 | Adlerstein ....................... 204/192.25 |
| 5,158,909 | * | 10/1992 | Ohtsuka et al. ...................... 438/573 |
| 5,210,051 | * | 5/1993 | Carter, Jr. ............................... 438/22 |
| 5,345,100 | * | 9/1994 | Kan et al. ............................ 257/475 |
| 5,409,859 | * | 4/1995 | Glass et al. ........................... 438/523 |
| 5,622,877 | * | 4/1997 | Ashkinazi et al. .................... 438/571 |
| 5,770,489 | * | 6/1998 | Onda ................................... 438/167 |
| 5,782,996 | * | 7/1998 | Fan ....................................... 148/33.1 |
| 5,847,437 | * | 12/1998 | Chang et al. ......................... 257/471 |
| 5,888,891 | * | 3/1999 | Gould ................................... 438/575 |
| 5,940,694 | * | 8/1999 | Bozada et al. ....................... 438/172 |
| 6,051,851 | * | 4/2000 | Ohmi et al. .......................... 257/185 |

FOREIGN PATENT DOCUMENTS

2408166 * 2/1973 (DE) .

OTHER PUBLICATIONS

A. Castaldini, D. Cavalcoli, and A. Cavallini; Degradation Effects at Aluminum–Silicon Schottky Diodes; 1998; Electrochemical and Solid–State Letters, I (2) 83–85.

* cited by examiner

*Primary Examiner*—Eddie C. Lee
*Assistant Examiner*—José R. Diáz
(74) *Attorney, Agent, or Firm*—Fish & Richardson P.C.

(57) ABSTRACT

A Schottky rectifier has multiple stages with substantially identical or very similar structures. Each stage includes a nitride-based semiconductor layer, a Schottky contact formed on one surface of the semiconductor layer, and an ohmic contact formed on an opposite surface of the semiconductor layer. The Schottky layer is formed from a metallic material with a high metal work function, and the ohmic contact is formed from a metallic material with a low metal work function. At least one of the stages is a middle stage located between two adjacent stages, such that the Schottky contact of the middle stage and the ohmic contact of one of the adjacent stages are joined together, and such that the ohmic contact of the middle stage and the Schottky contact of another one of the adjacent stages are joined together.

17 Claims, 3 Drawing Sheets

MULTIPLE STAGE HIGH POWER DIODE

CROSS REFERENCE TO RELATED APPLICATIONS

This application claims the benefit of U.S. Provisional Application No. 60/080,875, filed on Apr. 6, 1998.

STATEMENT AS TO FEDERALLY SPONSORED RESEARCH

The U.S. Government may have certain rights in this invention pursuant to Grant No. N-00014-92-J-1845 awarded by the Navy.

TECHNOLOGICAL FIELD

The invention relates to semiconductor devices and, in particular, to high power diodes.

BACKGROUND

One structure for a semiconductor diode, such as a Schottky rectifier, includes a semiconductor layer onto which two metal contacts, including an ohmic contact and a Schottky contact, are formed. In high-power applications, these diodes must be able to withstand relatively large reverse-bias voltages without breaking down, i.e., without conducting current in the reverse direction. One factor that influences the reverse breakdown voltage is the width of the depletion region in the semiconductor layer. In general, a wider depletion region, and thus a wider diode, has a higher reverse breakdown voltage.

The doping level of the diode's semiconductor layer also influences its reverse breakdown voltage. In general, a lower doping level leads to a wider depletion region, which, in theory, leads to better performance in high power applications. However, reducing the doping level also increases the diode's on-state resistance, i.e., the resistance of the diode when conducting in the forward-bias mode. Greater on-state resistance leads to increased voltage drop across the diode, which limits the diode's utility and efficiency in many applications. As a result, reductions in doping level and corresponding gains in reverse breakdown voltage are limited by the acceptable on-state resistance of the diode.

SUMMARY

The inventors have developed a high-power device that withstands relatively large reverse-bias voltages with relatively low on-state resistance. This device exhibits an on-state resistance that is often many times smaller than the on-state resistances of similarly sized devices with similar reverse breakdown characteristics. For example, one particular device, described below, has an on-state resistance that is approximately 30 times smaller than the on-state resistance of a conventional device of similar size having a similar reverse breakdown voltage.

In one aspect, the invention features a semiconductor diode that includes at least two stages, each having a semiconductor layer and two conductive contacts. The stages are arranged such that a contact on one of the stages and a contact on another of the stages are joined together.

In some embodiments, the two contacts on each stage are formed from different materials. For example, a metallic material with a high metal work function, such as gold, palladium, platinum, or rhenium, often is used to form an ohmic contact on each stage, while a metallic material with a low metal work function, such as titanium or titanium aluminum, is used to form a Schottky contact. The semiconductor layers are formed from any of a wide variety of materials, including nitride-based materials, such as GaN and AlGaN, and carbide-based materials, such as SiC. In some embodiments, the materials used to form the semiconductor layers vary from stage to stage. In other embodiments, the semiconductor layer in one or more of the stages has a varying doping concentration.

In another aspect, the invention features a Schottky rectifier having multiple stages with substantially identical or very similar structures. Each stage includes a nitride-based semiconductor layer, a Schottky contact formed on one surface of the semiconductor layer, and an ohmic contact formed on an opposite surface of the semiconductor layer. The Schottky layer is formed from a metallic material with a high metal work function, and the ohmic contact is formed from a metallic material with a low metal work function. At least one of the stages is a middle stage located between two adjacent stages, such that the Schottky contact of the middle stage and the ohmic contact of one of the adjacent stages are joined together, and such that the ohmic contact of the middle stage and the Schottky contact of another one of the adjacent stages are joined together.

Other aspects of the invention include techniques for use in fabricating high power Schottky rectifiers. One of these techniques includes forming a conductive contact layer on a semiconductor substrate, forming a semiconductor layer on a transfer substrate, and then forming a conductive contact layer on the semiconductor layer. The two conductive contact layers are then placed in contact with each other and bonded together. Upon removing the transfer substrate, two additional conductive contact layers are formed, one on an exposed surface of the semiconductor layer, and one on an exposed surface of the semiconductor substrate.

In some embodiments, a metallic material with a high metal work function is deposited on the semiconductor substrate to form a Schottky contact, and a metallic material with a low metal work function is deposited on the semiconductor layer to form an ohmic contact. Techniques for bonding the contact layers together include running an electrical current through the contact layers and applying heat to the contact layers.

Another technique for use in fabricating a high power Schottky rectifier includes forming a first conductive contact layer of a first type (e.g., a Schottky contact) on a semiconductor substrate and forming a second conductive contact layer of a second type (e.g., an ohmic contact) on the first conductive contact layer. Another semiconductor layer then is formed on the second conductive contact layer. A third conductive contact layer of the first type (e.g., Schottky) is formed on an exposed surface of the semiconductor layer, and a fourth conductive contact layer of the second type (e.g., ohmic) is formed on an exposed surface of the semiconductor substrate. The resulting structure is a rectifier having multiple stages.

Other embodiments and advantages will become apparent from the following description and from the claims.

DETAILED DESCRIPTION

Figure 1:
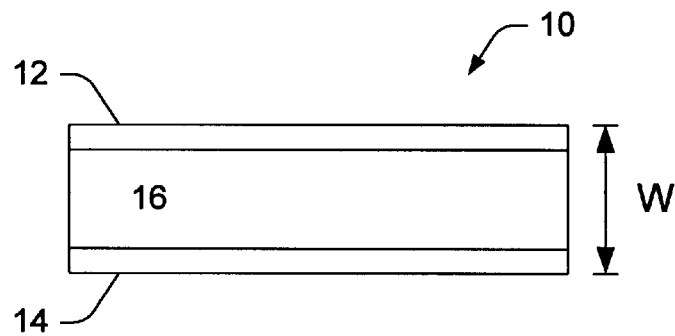
FIG. 1 is a cross-sectional view of a single stage Schottky diode.

FIG. 1 shows a semiconductor device, such as a Schottky rectifier 10, for which two contact layers 12, 14 are formed on opposite sides of a semiconductor substrate 16. One of the contact layers 12 forms a Schottky contact for the rectifier, and the other contact layer 14 forms an ohmic contact. The Schottky contact layer 12 typically includes a conductive metal or metal alloy having a high metal work function, such as gold (Au), palladium (Pd), platinum (Pt), or rhenium (Re). The ohmic contact layer 14 usually is formed from a conductive metal or metal alloy having a low metal work function, such as titanium (Ti) or titanium aluminum (TiAl). The semiconductor substrate 16 includes any of a wide variety of semiconductor materials. Materials and alloys such as silicon carbide (SiC), gallium nitride (GaN), and aluminum gallium nitride (AlGaN) are most useful in high power applications. The width of each contact layer is very small, and thus is negligible, in comparison to the width of the semiconductor layer.

As described above, the thickness, or width W, of the rectifier 10 influences its breakdown voltage. In general, an increase in the diode's width W and a corresponding reduction in the diode's doping concentration generates a roughly proportional increase in the rectifier's breakdown voltage. However, reduced doping concentration in turn leads to an undesirable increase in the rectifier's on-state resistance.

Figure 2:
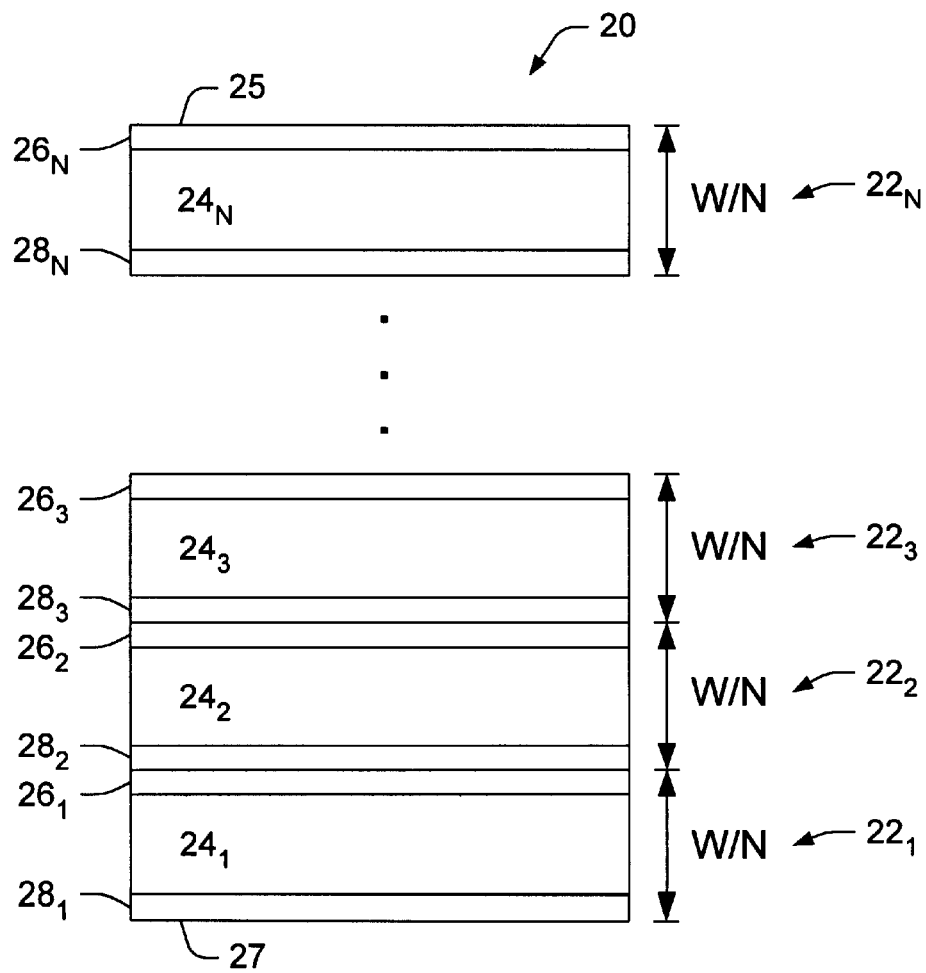
FIG. 2 is a cross-sectional view of a multiple stage Schottky diode.

FIG. 2 shows a Schottky rectifier 20 that exhibits much lower on-state resistance than the rectifier 10 of FIG. 1. This rectifier 20 is a multiple stage device having N repeating stages $22_1$–$22_N$ that each resemble the single stage rectifier 10 of FIG. 1. Like the single stage rectifier 10, each of the N stages $22_1$–$22_N$ includes a semiconductor layer $24_1$–$24_N$ having a Schottky contact layer $26_1$–$26_N$ on one surface and an ohmic contact layer $28_1$–$28_N$ on another surface. The N stages $22_1$–$22_N$ are arranged so that, except for the contact layers $26_N$, $28_1$ at the two ends 25, 27 of the device 20, the Schottky contact layer $26_1$–$26_N$ for each stage contacts the ohmic contact layer $28_1$–$28_N$ for an adjacent stage.

Each of the N stages $22_1$–$22_N$ has a thickness of W/N, so the multiple stage device 20 has a total thickness of W and therefore has approximately the same breakdown voltage as the single stage diode 10 of FIG. 1. Because the multiple stage device 20 is constructed from N repeating elements, each of the individual stages $22_1$–$22_N$ is required to withstand only 1/N of the reverse breakdown voltage of the device. This lower breakdown voltage requirement allows for a wider depletion region in each stage, which in turn allows for higher doping concentrations. As a result, the on-state resistance of the multiple stage device is much lower than the on-state resistance of a single stage device.

For GaN rectifiers, the on-state resistance of an N-stage device is approximately $N^{1.5}$ times lower than the on-state resistance of a similarly sized single stage device. For example, a typical Si-based, single stage rectifier with a reverse breakdown voltage of 5 kV exhibits an on-state resistance of approximately 10 Ω/cm². A GaN-based, single stage rectifier with a similar reverse breakdown voltage exhibits an on-state resistance of approximately 1.0 mΩ/cm² to 10 mΩ/cm². A GaN-based rectifier with ten repeating stages and a reverse breakdown voltage of 5 kV exhibits an on-state resistance that is approximately 30 times lower than the on-state resistance of the single stage GaN-based rectifier, i.e., between 0.03 mΩ/cm² and 0.3 mΩ/cm². Higher doping levels also lead to lower semiconductor fabrication costs, which makes a multiple stage rectifier relatively inexpensive to produce.

The reverse breakdown voltage $V_B$ of each individual stage of the multiple stage rectifier is approximated by the following equation:

$$V_B = 23.6 \, [\text{eV}] \cdot E_g^4 \cdot \left(\frac{N_d \, [\text{cm}^{-3}]}{10^{16}}\right)^{-0.75} \quad [\text{V}]$$

where $E_g$ is the energy bandgap of the semiconductor material and $N_d$ is the doping concentration. The punch through voltage $V_{PT}$ for each stage occurs when the width of the depletion region equals the actual width W of the semiconductor layer, as shown in the following equation:

$$V_{PT} = \frac{qN_d W^2}{2\epsilon_0 \epsilon_r}$$

The doping concentration $N_d$ and the width W of each semiconductor layer, as functions of the required breakdown voltage $V_B$ and the bandgap $E_g$ of the semiconductor material, then are given by the equations:

$$N_d = \left(\frac{V_B}{23.6 \, E_g^4}\right)^{-4/3} \cdot 10^{16} \, \text{cm}^{-3}$$

$$W = 4.04 \cdot 10^{-2} V_B^{7/6} E_g^{-8/3} \, \mu\text{m}$$

Therefore, for an N-stage device, the total thickness W' equals N·W, and the total breakdown voltage $V_B$' equals N·$V_B$. The required thickness W of each individual stage scales to approximately $(V_B'/N)^{7/6}$. The required doping level $N_d$ of each stage scales to approximately $(V_B'/N)^{-4/3}$, which is proportional to $N^{4/3}$. The total on-state resistance $R_{ON}$ for each stage is given by the value $(N \cdot W)/(q \cdot N_d \cdot \mu)$, which scales to approximately $(V_B')^{5/2} \cdot N^{3/2}$.

Figure 3A:
FIGS. 3A through 3D illustrate one technique for fabricating a multiple stage Schottky diode.
Figure 3B:
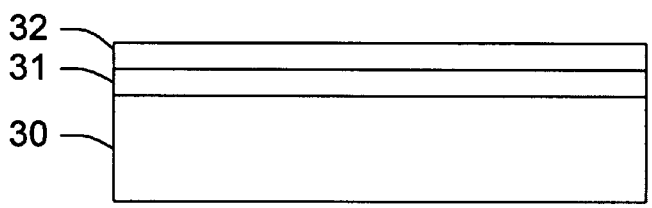
Figure 3C:
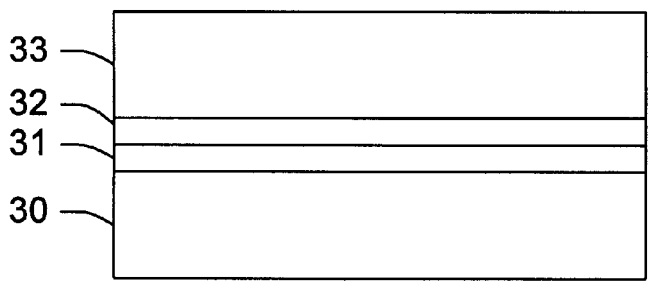

FIGS. 3A through 3D show one technique for fabricating a multiple stage rectifier. First, a Schottky contact layer 31 is formed on a semiconductor substrate 30 (FIG. 3A). One technique for doing so is by depositing a Schottky contact material, such as Au, Pd, or Pt, onto a substrate made or grown from a semiconductor or semiconductor alloy, such as GaN, AlGaN, or SiC. An ohmic contact layer 32 then is formed on the Schottky contact layer 31 (FIG. 3B). The ohmic contact layer 32 typically includes a low work function metal or metal alloy, such as Ti or TiAl. A second semiconductor layer 33 then is formed on the ohmic contact layer 32 (FIG. 3C).

Figure 3D:
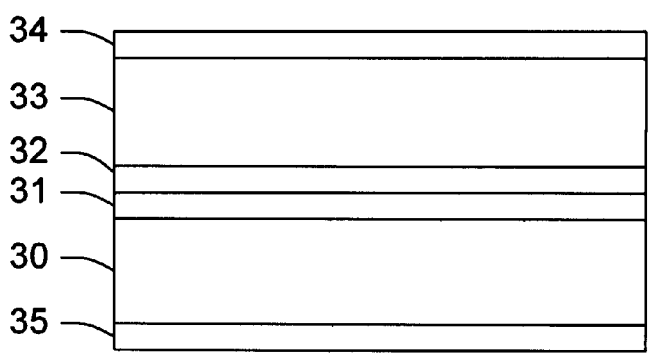

This process of depositing Schottky contact and ohmic contact layers and growing semiconductor layers continues for each additional stage to be added to the multiple stage device. When all of the stages have been added, one final Schottky contact layer 34 and one final ohmic contact layer 35 are formed on opposite ends of the device (FIG. 3D). In the example shown, the original semiconductor substrate 30, the initial Schottky contact layer 31, and the final ohmic contact layer 35 together form one stage of the device. The second substrate layer 33, the final Schottky contact layer 34, and the initial ohmic contact layer 32 together form another stage of the device.

Figure 4A:
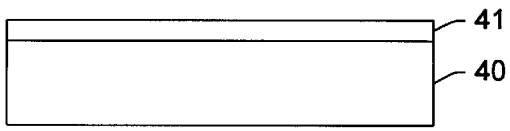
FIGS. 4A through 4F illustrate another technique for fabricating a multiple stage Schottky diode.
Figure 4B:
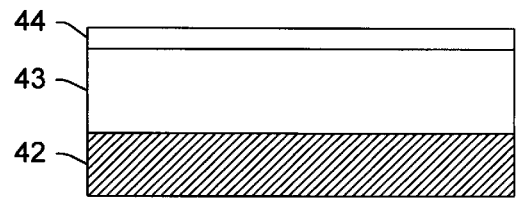

FIGS. 4A through 4F show an alternative technique for fabricating a multi-stage rectifier. Fabrication begins with two substrates, a semiconductor substrate 40 onto which a Schottky contact layer 41 is deposited (FIG. 4A), and a transfer substrate 42 onto which a semiconductor layer 43 is grown (FIG. 4B). The semiconductor substrate 40 and the Schottky contact layer 41 together form the first stage of the multiple state device.

The transfer substrate 42 is formed from any of a wide variety of materials. In fabricating GaN-based devices, materials such as GaP and sapphire are particular useful. After the semiconductor layer 43 is formed on the transfer substrate 42, an ohmic contact layer 44 is formed on the semiconductor layer 43. Together the semiconductor layer 43 and the ohmic contact layer 44 form the second stage of the multiple stage device.

Figure 4C:
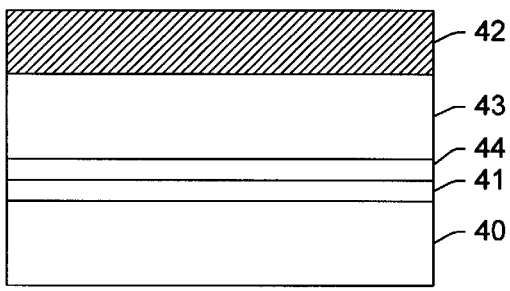

The second stage, including the transfer substrate 42, then is placed over the first stage so that the Schottky contact layer 41 and the ohmic contact layer 44 are in contact (FIG. 4C). These contact layers 41, 44 then are bonded together, using any of a variety of techniques. For example, techniques such as running a large electrical current through the two stages or applying heat to the two stages are useful in bonding Schottky and ohmic contact layers that are formed from the high work function and low work function metals described above.

Figure 4D:
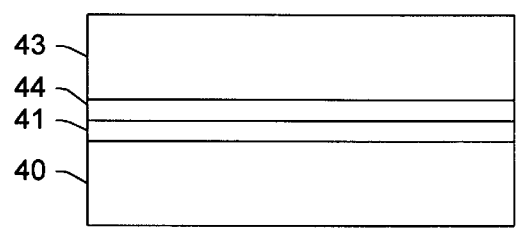

Once the two stages are bonded together, the transfer substrate 42 is removed from the second semiconductor layer 43, leaving only the two semiconductor layers 40, 43 and the two contact layers 41, 44 (FIG. 4D). Several techniques exist for removing the transfer substrate 42, including conventional "compliant" substrate removal techniques, as well as conventional grinding and polishing techniques.

Figure 4E:
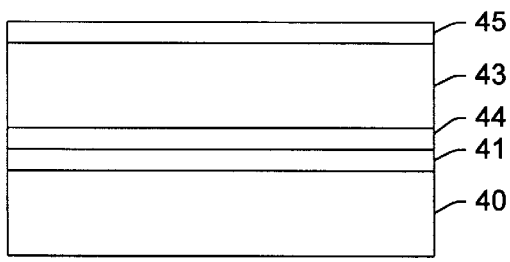
Figure 4F:
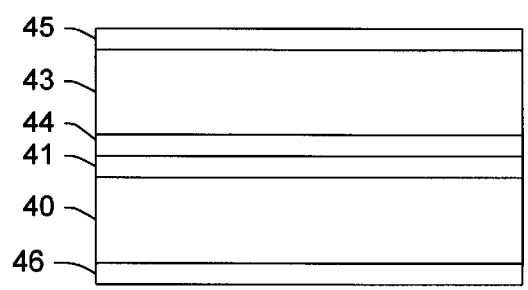

A second Schottky contact layer 45 is then formed on the exposed surface of the second semiconductor layer 43 to complete the second stage (FIG. 4E). This process of forming a semiconductor layer and an ohmic contact layer on a transfer substrate, bonding these layers to the multiple stage device, removing the transfer substrate, and then forming an additional Schottky contact layer is repeated for each stage to be added to the device. After all of the stages have been added, a final ohmic contact layer 46 is formed on the exposed surface of the original semiconductor substrate 40 to complete the first stage (FIG. 4F).

Several embodiments of the invention are described in detail above, but various modifications are possible without departing from the spirit and the scope of the invention. For example, some multiple stage devices require virtually identical structure among all of the stages, while other devices allow or even require variations among the stages. In some devices, the semiconductor materials used to form the semiconductor layers vary from stage to stage. In other devices, the semiconductor doping concentration varies within a single stage. One technique for varying the doping concentration within a stage is by forming multiple semiconductor layers with varying doping levels. In other devices, the materials used to form the Schottky contact layers and the ohmic contact layers vary among the stages.

Accordingly, other embodiments are within the scope of the following claims.

What is claimed is:

1. A method for use in fabricating a high power Schottky rectifier, the method comprising:
    forming a first conductive contact layer on a semiconductor substrate;
    forming a semiconductor layer on a transfer substrate;
    forming a second conductive contact layer on the semiconductor layer;
    placing said first and second conductive contact layers in contact with each other;
    bonding said first and second conductive contact layers to each other;
    removing the transfer substrate to expose a surface of the semiconductor layer; and
    forming third and fourth conductive contact layers, said third conductive contact layer on the exposed surface of the semiconductor layer, and said fourth conductive contact layer on an exposed surface of the semiconductor substrate.

2. The method of claim 1, wherein forming the first conductive contact layer on the semiconductor substrate includes depositing a metallic material on the semiconductor substrate to form a Schottky contact.

3. The method of claim 2, wherein depositing the metallic material includes depositing a material having a high metal work function.

4. The method of claim 2, wherein depositing the metallic material includes depositing a material selected from a group including gold, palladium, platinum, and rhenium.

5. The method of claim 1, wherein forming the second conductive contact layer on the semiconductor layer includes depositing a metallic material on the semiconductor material to form an ohmic contact.

6. The method of claim 5, wherein depositing the metallic material includes depositing a material having a low metal work function.

7. The method of claim 5, wherein depositing the metallic material includes depositing a material selected from a group including titanium and titanium aluminum.

8. The method of claim 1, wherein forming the semiconductor layer on the transfer substrate includes growing a nitride-based semiconductor material on the transfer substrate.

9. The method of claim 1, wherein bonding said first and second conductive contact layers together includes running an electrical current through said first and second conductive contact layers while they are in contact with each other.

10. The method of claim 1, wherein bonding said first and second conductive contact layers together includes applying heat to said first and second conductive contact layers while they are in contact with each other.

11. The method of claim 1, wherein forming said third and fourth conductive contact layers includes depositing a metallic material on the exposed surface of the semiconductor substrate to form an ohmic contact.

12. The method of claim 1, wherein forming said third and fourth conductive contact layers includes depositing a metallic material on the exposed surface of the semiconductor layer to form a Schottky contact.

13. A method for use in fabricating a high power Schottky rectifier, the method comprising:
    forming a first conductive contact layer of a first type on a semiconductor substrate;
    forming a second conductive contact layer of a second type on the first conductive contact layer;
    forming a semiconductor layer on the second conductive contact layer;
    forming a third conductive contact layer of the first type on an exposed surface of the semiconductor layer; and
    forming a fourth conductive contact layer of the second type on an exposed surface of the semiconductor substrate.

14. The method of claim 13, wherein forming the conductive contact layers of the first type includes depositing at least one metallic material to form Schottky contacts.

15. The method of claim 14, wherein depositing at least one metallic material includes depositing a material having a high metal work function.

16. The method of claim 13, wherein forming the conductive contact layers of the second type includes depositing at least one metallic material to form ohmic contacts.

17. The method of claim 16, wherein depositing at least one metallic material includes depositing a material having a low metal work function.

* * * * *